United States Patent [19]
Bennett et al.

[11] Patent Number: 5,124,108
[45] Date of Patent: Jun. 23, 1992

[54] METHOD FOR MAKING CONNECTOR FOR POSTED TERMINALS

[75] Inventors: Glenn E. Bennett, Glendale; Donald F. Urgo, Tempe, both of Ariz.

[73] Assignee: AMP Incorporated, Harrisburg, Pa.

[21] Appl. No.: 397,624

[22] Filed: Aug. 11, 1989

Related U.S. Application Data

[63] Continuation of Ser. No. 175,013, Mar. 30, 1988, abandoned.

[51] Int. Cl.$^5$ ............................................. B29C 45/36
[52] U.S. Cl. ................................. 264/328.1; 425/468; 425/577; 29/883
[58] Field of Search ............... 264/328.1, 328.8, 328.9, 264/272.16, 272.17, 272.18; 425/577, 468; 249/142, 151, 175; 29/883, 874, 884

[56] References Cited

U.S. PATENT DOCUMENTS

| | | | |
|---|---|---|---|
| 3,255,427 | 6/1966 | Yeiser | 439/595 |
| 3,545,606 | 12/1970 | Bennett et al. | 29/739 |
| 3,559,249 | 2/1971 | Patton, Jr. | 425/577 |
| 3,747,047 | 7/1973 | Carter et al. | 439/141 |
| 4,334,727 | 6/1982 | Scheingold et al. | 439/71 |
| 4,359,252 | 11/1982 | Olsson et al. | 439/71 |
| 4,786,256 | 11/1988 | Angeleri et al. | 439/72 |

OTHER PUBLICATIONS

AMP Data Sheet No. 77-446 Revised Apr. 1978 pp. 14-179, AMP Inc. Harrisburg, Pa.
AMP Catalog 79-552 Revised Jun. 1982 p. 5 AMP Inc. Harrisburg, Pa.

*Primary Examiner*—Jill L. Heitbrink
*Attorney, Agent, or Firm*—Anton P. Ness

[57] ABSTRACT

Terminals having rectangular post sections of very small dimension are secured in housing passageways of an electrical connector, which passageways are molded using core pins larger in dimension than said very small dimensioned terminal post sections, so that the oversized core pins are robust and endure repeated molding cycles. End sections of the core pins have the very small dimension of the terminal post sections and the passageways have constricted end sections which precisely locate the terminal post section along the connector mating face. An increased terminal width at the insertion face creates an interference fit within the passageway for retention. The core pin has a strength rib along most of one side and the forward rib end is tapered to the reduced-dimension pin end section which results in a tapered passageway transition surface to eliminate terminal stubbing during insertion. The rib has tapered side surfaces therealong extending to the adjacent side surfaces of the otherwise rectilinear core pin, and the resulting tapered surfaces along the molded passageway tend to urge the terminal post section during insertion towards the opposing side wall assisting axial alignment of the terminal post section.

3 Claims, 6 Drawing Sheets

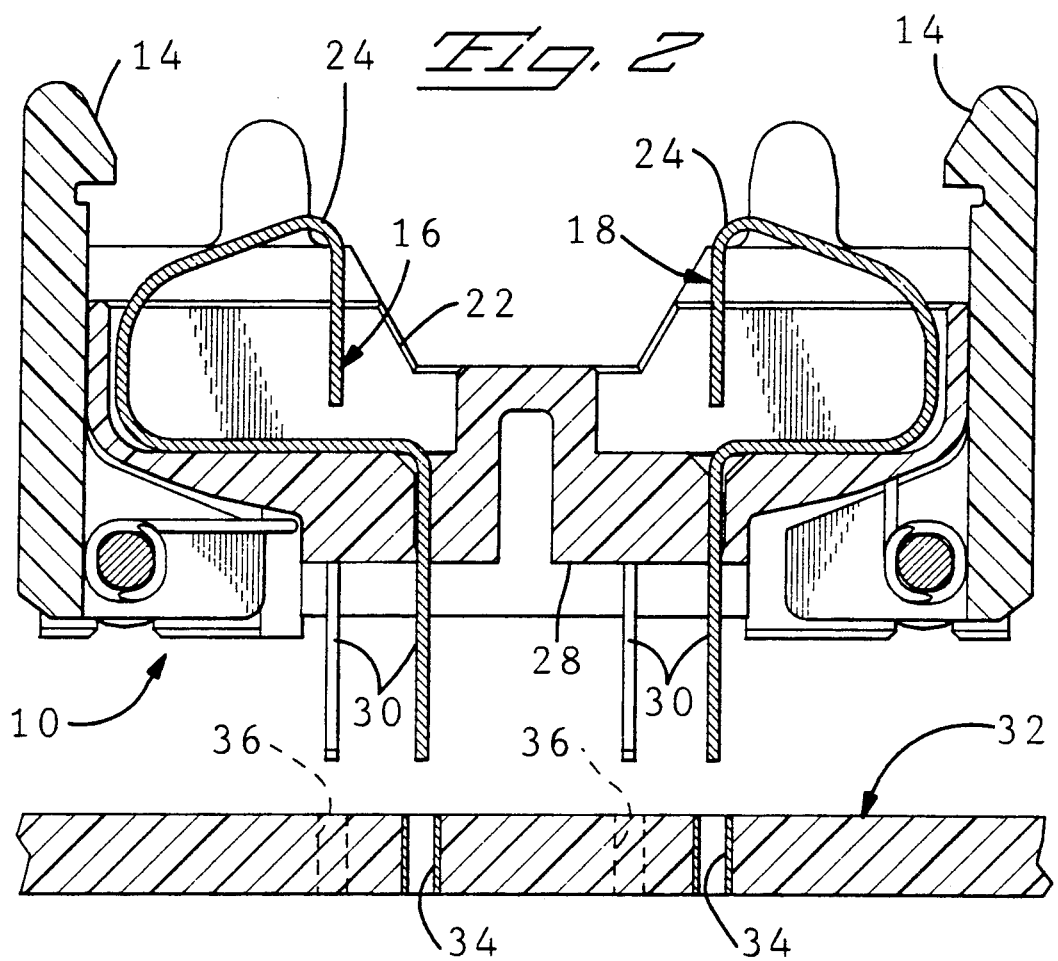
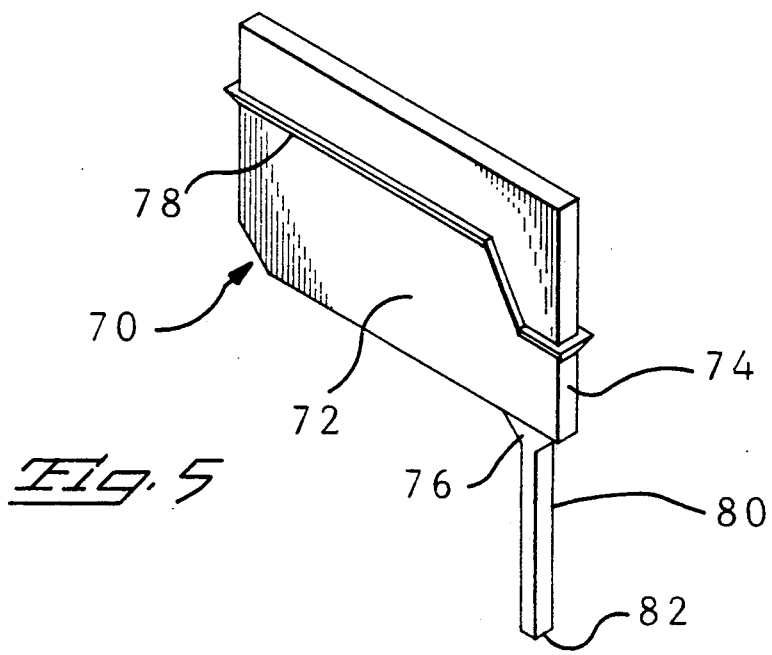

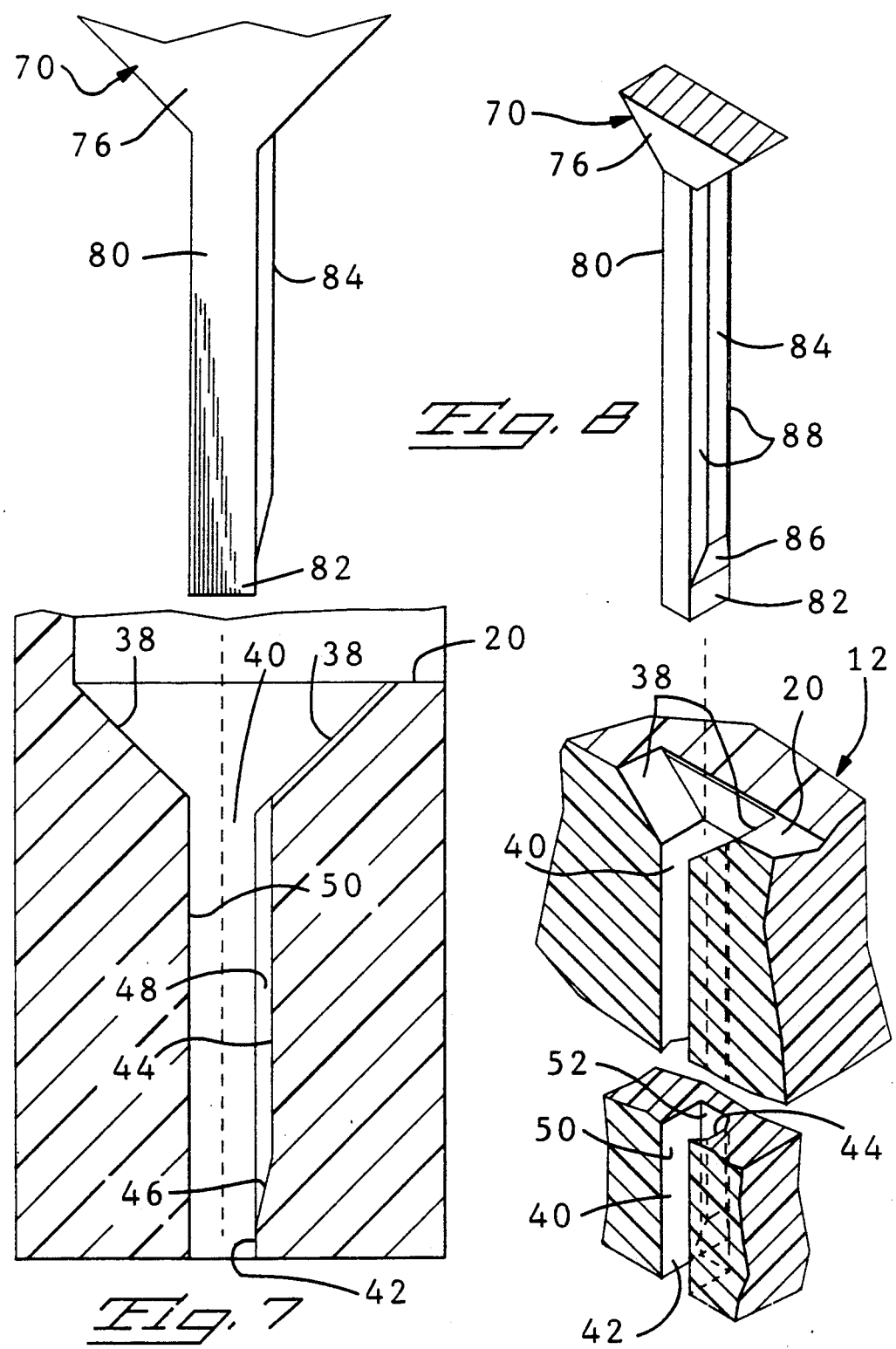

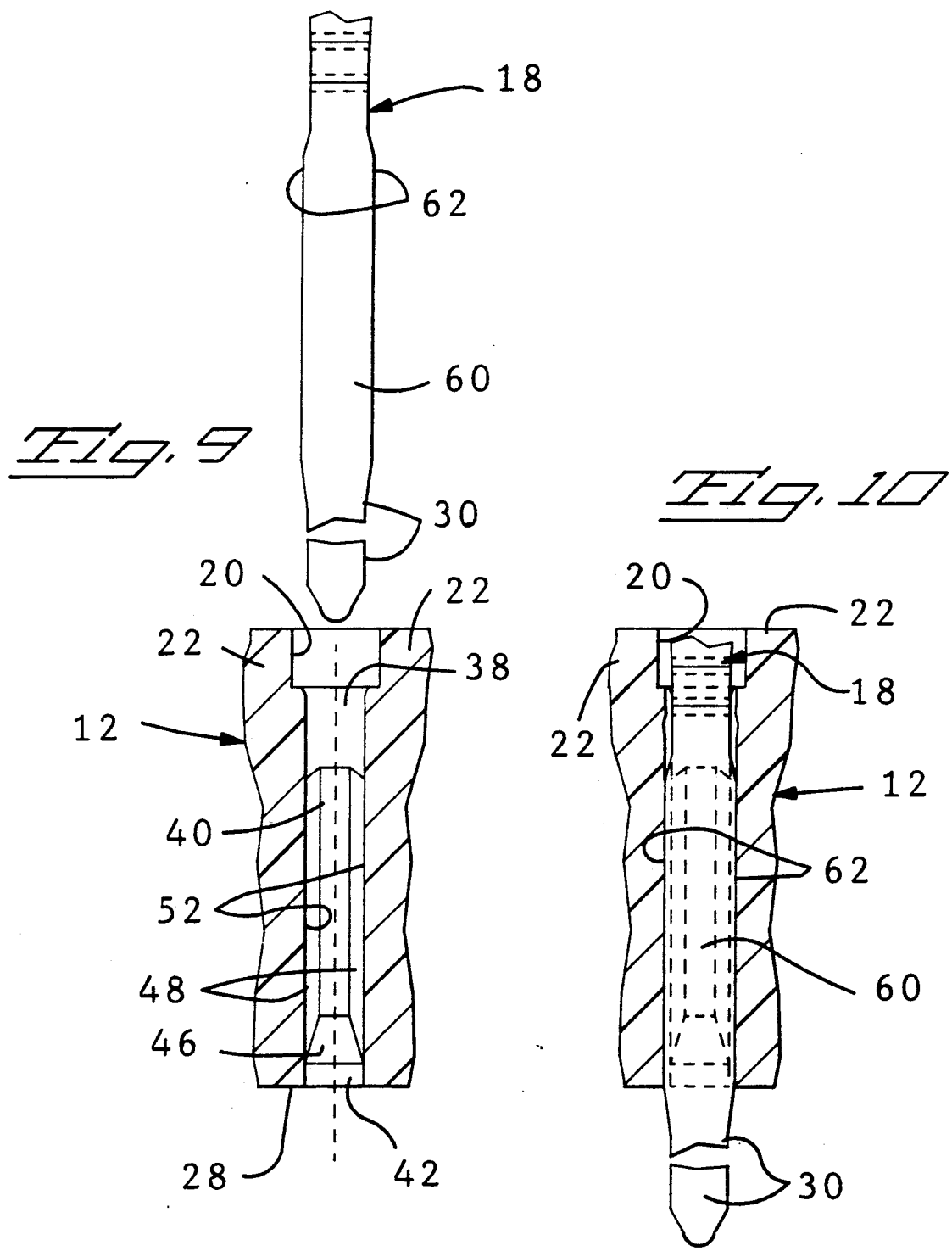

METHOD FOR MAKING CONNECTOR FOR POSTED TERMINALS

This application is a continuation of application Ser. No. 07/175,013 filed Mar. 30, 1988, now abandoned.

FIELD OF THE INVENTION

The present invention relates to electrical connectors and more particularly to connectors for terminals having post sections for connection to printed circuit panels.

BACKGROUND OF THE INVENTION

Electrical connectors are known in which terminals have post sections for electrical connection to socket means such as plated through-holes of printed circuit panels, where the post section cross-section is rectangular with very small dimensions and where the array of post sections must be axially aligned and positioned precisely enough to correspond with an array of holes in the panel to be mounted thereto. An example of such a connector is a burn-in socket as described in U.S. Pat. No. 4,786,256. Such a burn-in socket is first mounted to a printed circuit panel and then has removably mounted thereto a semiconductor package, which is an electrical connector having an integrated circuit chip secured therewithin, in order to test the semiconductor package to ensure its proper functioning. Such a test involves placing the package assembled in the burn-in socket mounted on a burn-in panel, into a large convection oven and operating the package electrically at elevated temperatures for an appropriate length of time, called "burn-in". Terminals of the chip connector are electrically joined to leads of the chip and have contact sections exposed for connection to corresponding contact means of an electrical article such as a printed circuit panel for in-service use. The burn-in socket includes terminals which electrically connect these semiconductor package contact sections to the burn-in circuit panel. Such a burn-in procedure involves many semiconductor packages in respective burn-in sockets simultaneously on a single burn-in panel, and the terminals of the sockets include post sections extending below the socket to be soldered within plated through-holes or other socket means of the burn-in panel. An example of such a post section would be one with a rectangular cross-section having dimensions of 0.0135 by 0.0170 inches, where the length of the post section would be about 0.338 inches of which about 0.098 inches would be retained within the housing passageway and the remainder of 0.240 inches would extend outwardly from the housing to electrically connect with the burn-in panel socket means.

A major concern in the manufacture of the burn-in sockets is the retention, alignment and precise positioning of the very small dimensioned post sections of terminals inserted into housing passageways for mounting to the burn-in panel. It would be desirable for the passageways of the dielectric housing of the burn-in socket to be very closely dimensioned and shaped to match the dimension and shape in cross-section of the post sections so that the passageway holds the post section at a precise position along the panel-mating face, and that at each location along the length of the passageway the post section is closely held thereby keeping it axially aligned. If the core pin for molding a passageway for the terminal post section were to be dimensioned closely to the terminal discussed above, an exemplary core pin would be 0.014 by 0.021 inches over a length of 0.098 inches. However, to mold passageways having such very small cross-sectional dimensions is unrealistic due to the undesirable flexibility and the lack of durability of mold core pins having such very small dimensions.

One method of attaining these goals has been to mold a larger-dimensioned passageway generally rectangular in cross-section and then to compensate by relying on a retention feature on the terminal to coact with the larger passageway to retain the terminal centered in the passageway. It has proven difficult to form an adequate retention feature by stamping a kink, for example, on the post section of the terminal outward from one side of the terminal to engage the passageway wall on that side, and still result in the post section on both sides of the feature being precisely axially aligned prior to as well as during terminal insertion into the passageway. It is desired to obtain assured better positioning and axial alignment of the terminal post section than can be accomplished with the prior art method.

SUMMARY OF THE INVENTION

According to the present invention, terminals having rectangular post sections of very small dimension are secured in housing passageways of an electrical connector, which passageways are molded using core pins larger in dimension than said very small dimensioned terminal post sections, so that the core pins are robust and endure repeated molding cycles. End sections of the core pins are reduced to the very small dimension of the terminal post sections which results in the passageways molded therearound having constricted tips which precisely locate the terminal post section along the connector mating face after insertion as it exits the passageway. Retention of the terminal can be accomplished by an increased width of the terminal post section creating an interference fit within the passageway at the terminal-receiving face of the connector, which increased width is located along the terminal at a position so selected that the interference fit does not occur until the terminal is substantially fully inserted, permitting unhindered loading and precise locating of the terminal post section by the reduced passageway end section.

The core pin of the present invention has a wide rib along one side thereof for almost its full length, and the forward end of the rib is tapered to the reduced-dimension end section of the core pin which results in a tapered transition surface just rearwardly of the reduced-dimension passageway end section eliminating stubbing of the leading end of the terminal during insertion. The rib has tapered side surfaces therealong extending to the adjacent side surfaces of the otherwise rectilinear core pin, and the resulting tapered surfaces along the molded passageway tend to urge the terminal post section during insertion towards the side wall opposed from the wall formed by the rib side of the core pin, assisting axial alignment of the terminal post section.

It is an objective of the present invention to provide an electrical connector for terminals having post sections of very small rectangular cross-section which are assuredly but economically retained in the connector housing passageways.

It is another objective to provide a means in the connector of precisely locating and axially aligning the post sections of the terminals within the passageways.

It is another objective to provide a method of molding a connector housing for such a connector where the core pins used to form the terminal-receiving passageways need not be as small in dimension as the terminal post sections and yet still result in passageways which precisely position and axially align the terminal post sections, so that the core pins are rigid and remain precisely aligned, and remain robust and durable for repeated molding cycles.

An example of a burn-in socket having the post-receiving passageway formed by the core pin according to the present invention will now be described by way of reference to the accompanying Figures in which:

BRIEF DESCRIPTION OF THE DRAWINGS

FIG. 2 is a cross-sectional view through a burn-in socket of FIG. 1 and shows a burn-in circuit panel.

FIG. 5 is a perspective view of one of the core units used to mold a slot and passageway into a socket housing for a terminal.

FIGS. 7 and 8 are elevation and perspective section views showing a core pin passageway section withdrawn from a housing passageway formed thereby.

FIGS. 9 and 10 illustrate a terminal being inserted into a passageway, and a terminal retention section in interference fit within the passageway, respectively.

DETAILED DESCRIPTION OF THE PREFERRED EMBODIMENT

Figure 1:
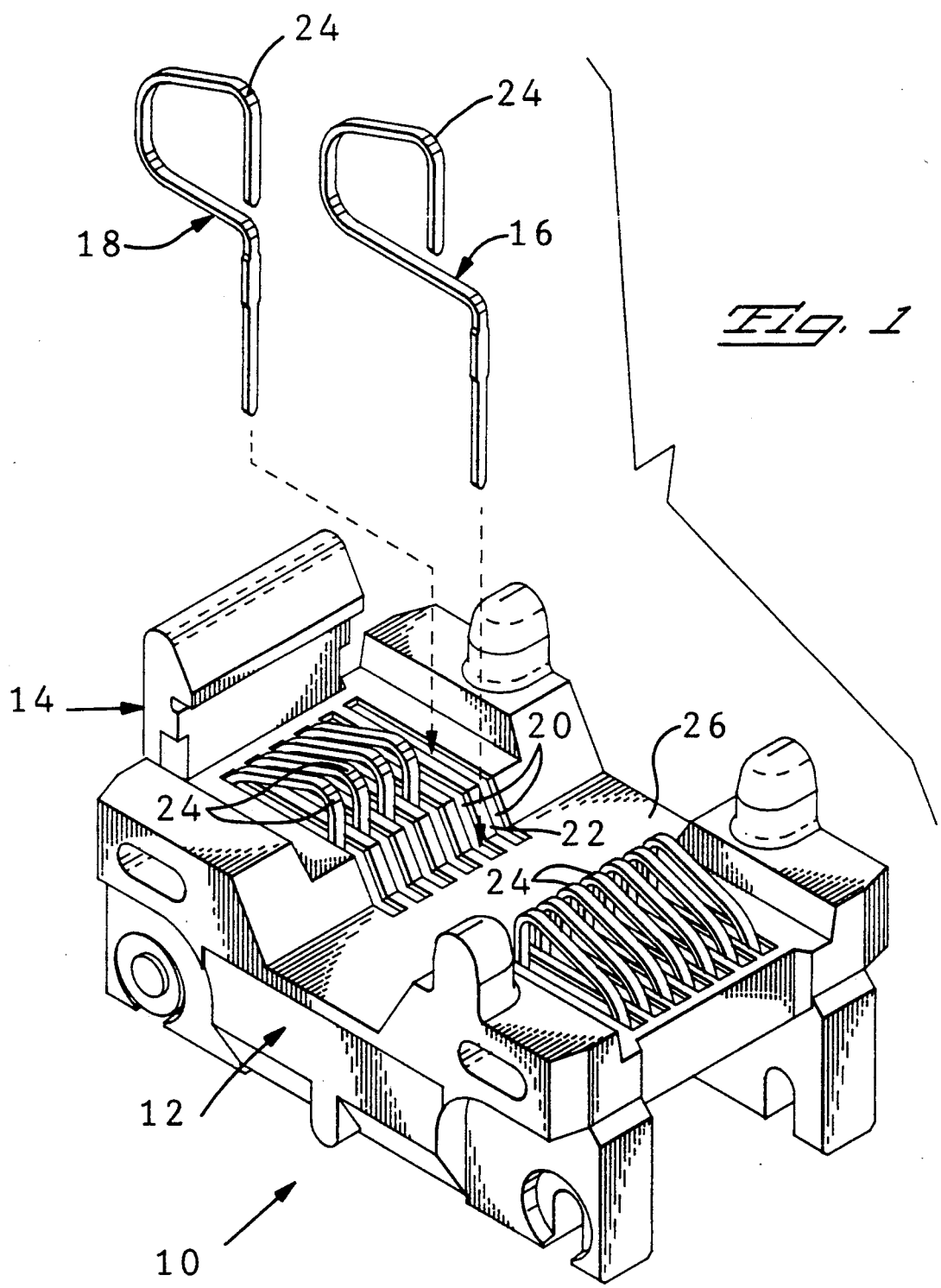
FIG. 1 is a perspective view of a burn-in socket from which two terminals are exploded, with one latch arm removed.

FIGS. 1 and 2 show a burn-in socket 10 which will be mounted onto a printed circuit panel 32 along with other like sockets to form an assembly for electrically testing a plurality of semiconductor packages (not shown) in a large convection oven (not shown) at elevated temperatures for periods of time. Such a burn-in socket and semiconductor package and their interrelationship and function is more particularly described in U.S. patent application Ser. No. 07/034,303 filed Apr. 3, 1987 and assigned to the assignee hereof. Socket 10 includes a dielectric housing 12 molded of thermoplastic material such as XYDAR (trademark of Amoco, Inc.) and includes a pair of latch arms 14 at opposed ends (one of which has been removed) to hold a semiconductor package inserted thereinto to be tested.

Terminals 16,18 alternate in each of two parallel rows and are secured in corresponding terminal-receiving slots 20 separated by walls 22. The body section of each terminal has a spring arm contact section 24 extending above the slot for being engaged and deflected by a corresponding lead of the semiconductor package to be tested, when the package is latched within area 26. Each terminal also includes a post section 30 a portion of which depends below panel-mating face 28 for insertion and soldering within a plated through-hole 34,36 or other socket means of panel 32 for electrical connection with circuitry thereof. The holes 34,36 of each array are precisely located and therefore the terminal post sections 30 must also be correspondingly precisely positioned along the panel-mating face 28 of socket 10 and additionally must be precisely vertically disposed to facilitate insertion.

Terminals 16,18 may be for example stamped and formed of beryllium nickel alloy. Spring analysis of the performance of spring arm contact section 24 determines the thickness of the alloy stock and hence the thickness of terminal post section 30. It is desired to fabricate them to have a rectangular cross-section of 0.0135 by 0.0170 inches. The housing passageways must also be able to accommodate such very small dimensioned post sections and provide for retention of the terminals in the housing while simultaneously precisely locating their post sections along panel-mating face 28 and keeping them perpendicular thereto Molding of the housing and its passageways must be accomplished with a view toward the later assembly of the terminals into the housing so that the fully fabricated socket is consistently good product within specifications especially regarding terminal positioning and alignment It is also preferred that the mold for such a housing be durable for many molding cycles, and therefore the housing passageway especially must be structured to be moldable from a durable core pin. The present invention provides a housing passageway which is moldable by a durable, robust core pin and still provides for insertion and retention of a very small dimensioned terminal post section therealong which is precisely positioned and perpendicularly aligned with respect to the housing's panel-mating face.

Figure 3:
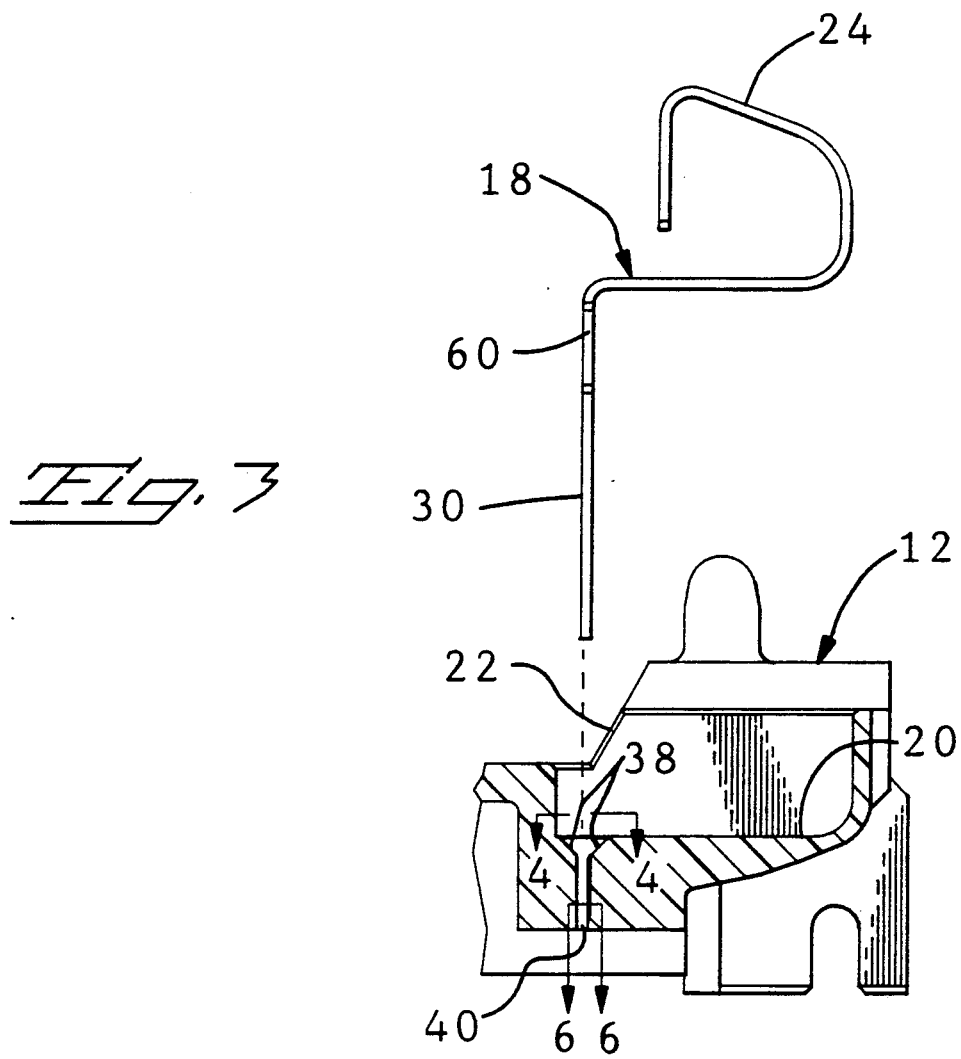
FIG. 3 is an enlarged cross-sectional view of the right side of the socket housing of FIG. 2 with one terminal exploded from its slot and passageway.
Figure 4:
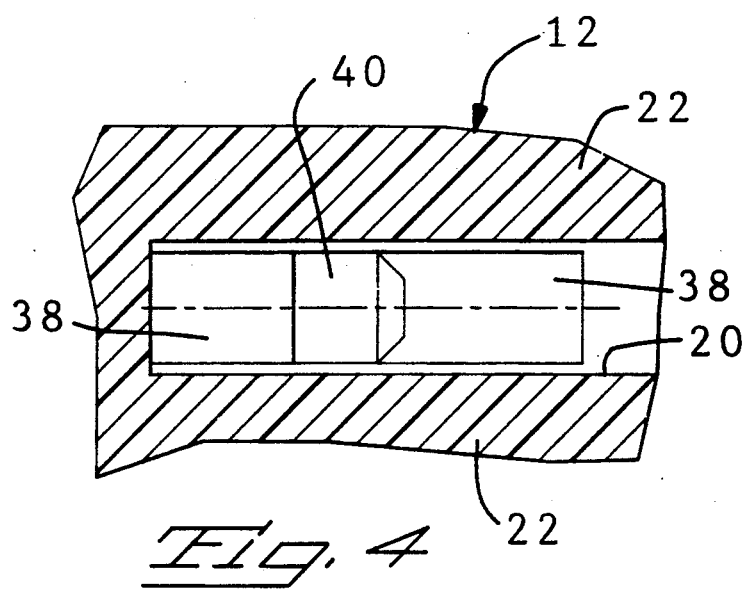
FIG. 4 is an enlarged section view of the terminal passageway taken along lines 4—4 of FIG. 3.

Referring to FIGS. 3 to 5, each passageway 40 includes an entrance defined by tapered lead-in surfaces 38 to facilitate insertion of the end of the post section 30 of a terminal 16,18 thereinto. Slot 20 and passageway 40 in communication therewith are formed during molding by a core unit 70 (FIG. 5) having a core plate section 72 corresponding to slot 20, and a core pin section 80 corresponding to passageway 40. Core pin 80 is integrally joined to plate section 72 near side edge 74 at base 76 which forms lead-in surfaces 38. Ledge 78 near the top of plate section 72 forms lead-in surfaces at the entrance to slot 20. Core pin 80 extends to a free end at end section 82 which will engage an opposed wall (not shown) of the mold cavity during molding of the housing 12, thus forming a through passageway 40.

Figure 6:
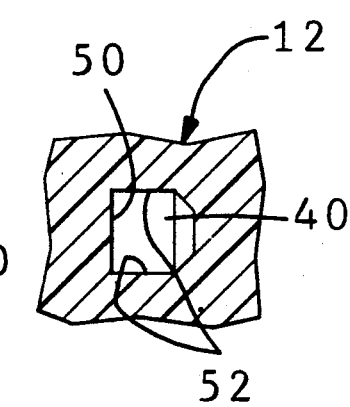
FIG. 6 is a part section view of the passageway taken along lines 6—6 of FIG. 3.

Regarding FIGS. 6 to 8, passageway 40 is generally rectangular in cross-section with a first side wall 50 and opposed side walls 52 adjacent to first side wall 50 being dimensioned closely to the cross-section of a terminal post section 30, or 0.021 inches wide and at least 0.014 inches thick. Fourth side wall 44 opposes first side wall 50 and is profiled to match the corresponding surface 82,84,86,88 of core pin 80 as shown in FIG. 8. Core pin 80 includes along that side surface and projecting outwardly therefrom a strength rib 84 extending from base 76 to a location just spaced inwardly from the free end at end section 82 where it concludes in a taper 86. End section 82 is both shaped and dimensioned in cross-section to mold a passageway end section 42 which closely corresponds to the cross-section of post section 30 of a terminal 16,18 so that post section 30 is precisely located along panel-mating face 28 of housing 12 as it exits passageway end section 42. Molded lead-in surface 46 formed by core pin surface 86 eliminates stubbing and snagging during terminal insertion.

Tapered surfaces 88 of rib 84 join sides of core pin 80 with the laterally facing surface of rib 84. The shape of rib 84 was selected to provide corresponding molded surfaces of passageway 40 capable of utility during later insertion of a terminal 16,18 and retention thereof in a precisely positioned and aligned state after assembly of burn-in socket 10, which will facilitate mounting to the burn-in printed circuit panel 32 of FIG. 2. The resulting tapered surfaces 48 along the passageway will engage the proximate corner edges of terminal post section 30 during insertion and urge the post section toward opposing first side wall 50. The core pin thus has a width of 0.021 inches while through the center of the rib is 0.0185 inches thick for example and approximates a square in cross-section.

In effect an oversize core pin is used to mold a passageway acting as if it has a smaller dimension, so that a more robust core pin, strengthened by rib 84, may be used which is capable of greater stability and longer mold life than a core pin which merely replicates the terminal post section in size and shape.

In FIGS. 9 and 10 a terminal 18 is shown being inserted into a passageway 40. Post section 30 includes widened section 60 at its inner end (see FIG. 3), which is for example 0.0225 inches wide and can extend for an axial length of about 0.095 inches which is approximately the length of passageway 40 in the present burn-in socket embodiment. Widened section 60 thus has flanges 62 extending outwardly from both sides which are larger than the width of passageway 40 between opposing second and third side walls 52, by for example a total of 0.0015 inches, but less than the width of slots 20 between walls 22. When post section 30 is almost fully inserted, flanges 62 enter passageway 40 and engage tapered side wall surfaces 46 and fully urge post section 30 against first side wall 50, and then penetrate or deform side walls 52 sufficiently to establish an interference fit upon complete insertion which can retain the terminal in housing 12. The interference fit in the present example generates an ample retention force of between about five and seven pounds.

It is preferred that after partial terminal insertion the leading end of post section 30 be then pulled by assembly apparatus to seat the terminal in the housing. Since passageway 40 maintains post section 30 adjacent first side wall 50 the entire passageway length, the post section is perpendicular to panel-mating face 28 when widened post section 60 begins passageway entry; the post section is thus precisely positioned and aligned when the interference fit begins which provides for terminal retention; pulling to seat the terminal best assures maintaining that position and alignment.

Figure 11:
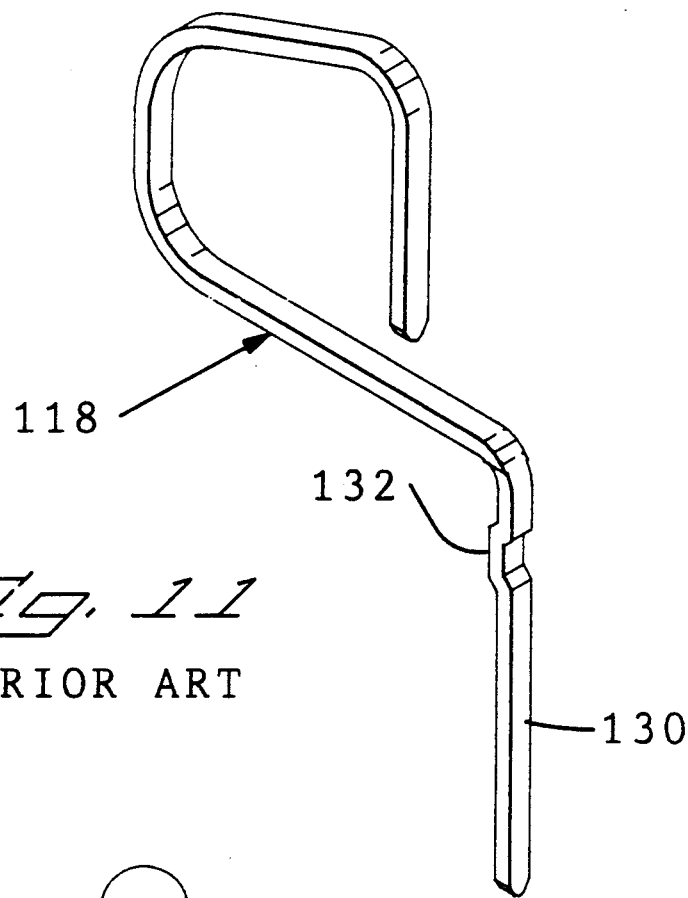
FIGS. 11 and 12 illustrate a PRIOR ART terminal and retention thereof in a housing passageway.
Figure 12:
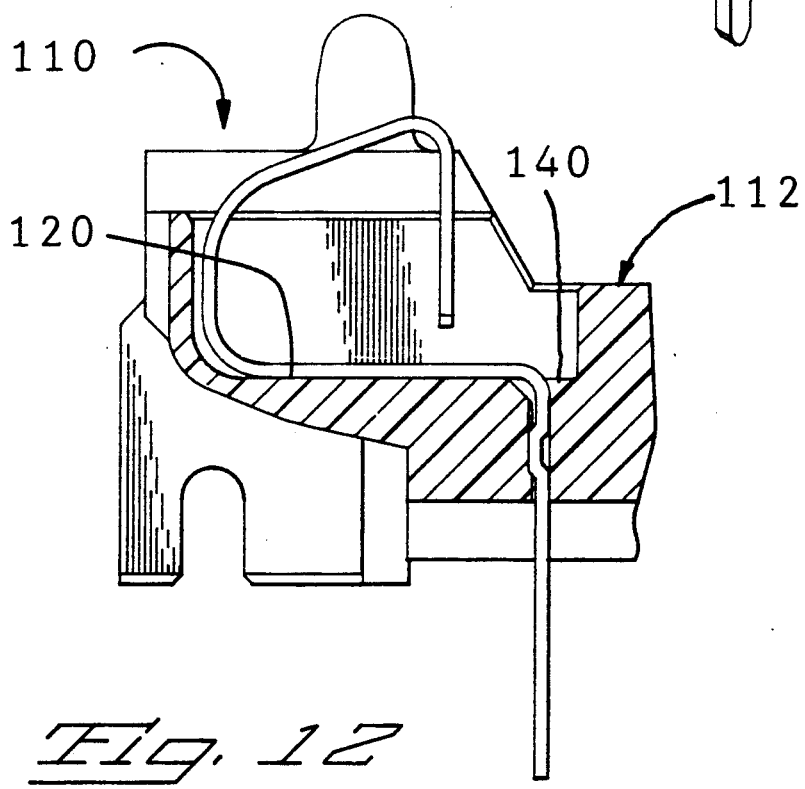

A prior art terminal retention is illustrated in FIGS. 11 and 12. Passageway 140 is dimensioned larger than the post section 130 of terminal 118, the result of the necessity to use larger core pins for stability during molding and economic mold life Kinked retention section 132 was used to establish an interference fit within the larger size passageway, but forming the kink too often resulted in slight misalignment of the post section, did not consistently result in precise positioning and perpendicular alignment desired in the eventual burn-in socket assembly, and further yielded lower, varying and unreliable retention forces.

The present invention can be utilized in electrical connectors other than burn-in sockets, where precise positioning of small dimensioned post sections is desired. The skilled artisan can make variations and modifications to the embodiment described herein while remaining within the spirit of the invention and the scope of the claims.

What is claimed is:

1. An improved method for molding in a mold cavity a housing for an electrical connector, said housing having at least one passageway extending therethrough from an insertion face to a mating face, said housing to receive within and along each said passageway an electrical terminal, wherein a core pin is utilized in the mold cavity to define each said passageway in an injection molding process, and wherein the terminal has a post section of very small cross-section which must be positionable upon insertion to extend from the housing passageway at a precise location along the mating face to correspond with a precisely located contact means of a panel to which said connector is to be mounted, the improvement comprising:

utilizing in the molding process core pins each of which extends to a free end from a base section and generally corresponds to the shape and dimension of the terminal post section of very small cross-section ultimately to be disposed in said housing passageway, each said core pin selectively departing from close correspondence with the shape and dimension of said terminal post section by being provided along one side thereof with an outwardly projecting rib extending longitudinally therealong from said base section of said core pin to a rib end at a location a small distance from said free end of said core pin;

each said core pin at said rib end thereof concluding in a short end section closely corresponding in dimension and shape cross-sectionally to said terminal post section and positioned to define a passageway end section along the mating face of the housing to be molded to correspond to the location of a said panel contact means; and upon being molded, the housing resulting from the molding process having said insertion face defined adjacent said core pin base section and said mating face defined adjacent said core pin free end, and the passageway end section formed by said core pin end section closely corresponding in dimension and shape cross-sectionally to the dimension and shape of said terminal post section and corresponding in position to the location of a said panel contact means, so that upon insertion of a said terminal post section through said passageway the outwardly extending terminal post section is precisely positioned by being closely held by said passageway end section, whereby a substantial length of said core pin is strengthened by said rib for repeated accurate molding while defining a said passageway adapted by reason of said passageway end section to precisely position the terminal post section.

2. The method of claim 1 wherein each said core pin includes a tapered transition section at said rib end extending to said core pin end section, and said passageway defined by said core pin has a tapered transition section corresponding to said core pin tapered transition section to prevent stubbing during insertion of a leading end of said terminal post section through said passageway.

3. The method of claim 2 wherein each said rib includes tapered side surfaces extending to adjacent side surfaces of said core pin, and said passageway has tapered surfaces corresponding to said tapered rib surfaces extending from a first passageway side wall formed by said side of said core pin having said rib therealong, to second and third passageway side walls adjacent to said first passageway side wall, said tapered surfaces having shapes to urge a respective said terminal post section being inserted through said passageway towards a fourth passageway side wall opposed from said first passageway side wall.

* * * * *